US011244723B1

(12) United States Patent
Karunaratne et al.

(10) Patent No.: US 11,244,723 B1
(45) Date of Patent: Feb. 8, 2022

(54) DEVICE FOR HIGH DIMENSIONAL ENCODING

(71) Applicants: INTERNATIONAL BUSINESS MACHINES CORPORATION, Armonk, NY (US); ETH ZURICH, Zurich (CH)

(72) Inventors: Kumudu Geethan Karunaratne, Gattikon (CH); Manuel Le Gallo-Bourdeau, Zurich (CH); Giovanni Cherubini, Rueschlikon (CH); Abu Sebastian, Adliswil (CH); Abbas Rahimi, Zurich (CH); Luca Benini, Zurich (CH)

(73) Assignees: International Business Machines Corporation, Armonk, NY (US); ETH ZURICH, Zurich (CH)

( * ) Notice: Subject to any disclaimer, the term of this patent is extended or adjusted under 35 U.S.C. 154(b) by 0 days.

(21) Appl. No.: 17/062,700

(22) Filed: Oct. 5, 2020

(51) Int. Cl.
*G11C 13/00* (2006.01)
*G06F 15/78* (2006.01)
*G06F 9/30* (2018.01)

(52) U.S. Cl.
CPC ........ *G11C 13/004* (2013.01); *G06F 9/30036* (2013.01); *G06F 15/7867* (2013.01); *G11C 2213/77* (2013.01)

(58) Field of Classification Search
CPC ............. G11C 13/004; G11C 2213/77; G06F 15/7867; G06F 9/30036
See application file for complete search history.

(56) References Cited

U.S. PATENT DOCUMENTS

| 10,219,722 B2 | 3/2019 | Tanttu |
| 2017/0192711 A1 | 7/2017 | Muralimanohar et al. |
| 2018/0075339 A1 | 3/2018 | Ma |
| 2019/0172552 A1 | 6/2019 | van Rooyen et al. |

OTHER PUBLICATIONS

Fan et al., "Hierarchical Temporal Memory Based on Spin-Neurons and Resistive Memory for Energy-Efficient Brain-Inspired Computing," in IEEE Transactions on Neural Networks and Learning Systems, vol. 27, No. 9, pp. 1907-1919, Sep. 2016, doi: 10.1109/TNNLS.2015.2462731. (Year: 2016).

(Continued)

*Primary Examiner* — Ajay Ojha
(74) *Attorney, Agent, or Firm* — Anthony M. Pallone

(57) ABSTRACT

The invention is directed to a device for high-dimensional encoding of a plurality of sequences of quantitative data signals. The device comprises a plurality of input channels for receiving the plurality of sequences of quantitative data signals and an encoding unit. The encoding unit is configured to perform a temporal high-dimensional encoding of n-grams of the plurality of sequences of quantitative data signals; thereby creating a plurality of temporally encoded hypervectors for the plurality of input channels. The encoding unit is further configured to perform a spatial high-dimensional encoding of the plurality of temporally encoded hypervectors, thereby creating a temporally and spatially encoded hypervector. The device further comprises a configuration controller. The configuration controller is adapted to configure the high-dimensional encoding in dependence on one or more hyperparameter values.

20 Claims, 6 Drawing Sheets

(56) References Cited

OTHER PUBLICATIONS

Imani et al., "Exploring Hyperdimensional Associative Memory," 2017 IEEE International Symposium on High Performance Computer Architecture (HPCA), 2017, pp. 445-456, doi: 10.1109/HPCA.2017.28 (Year: 2017).

IBM: List of IBM Patents or Patent Applications Treated as Related (Appendix P), Oct. 5, pp. 1-2.

Karunaratne et al., Pending U.S. Appl. No. 17/062,670, filed Oct. 5, 2020, entitled "Device for High Dimensional Encoding", pp. 1-34.

Moin et al., "An EMG Gesture Recognition System with Flexible High-Density Sensors and Brain-Inspired High-Dimensional Classifier", © 2018 IEEE, 5 pages.

Montagna et al., "PULP-HD: Accelerating Brain-Inspired High-Dimensional Computing on a Parallel Ultra-Low Power Platform", DAC '18, Jun. 24-29, 2018, 6 pages.

Wöhrle et al., "A Hybrid FPGA-Based System for EEG- and EMG-Based Online Movement Prediction", MDPI, Sensors Article, Published: Jul. 3, 2017, pp. 1-41.

Rahimi et al., "Hyperdimensional Biosignal Processing: A Case Study for EMG-based Hand Gesture Recognition", © 2016 IEEE, 8 pages.

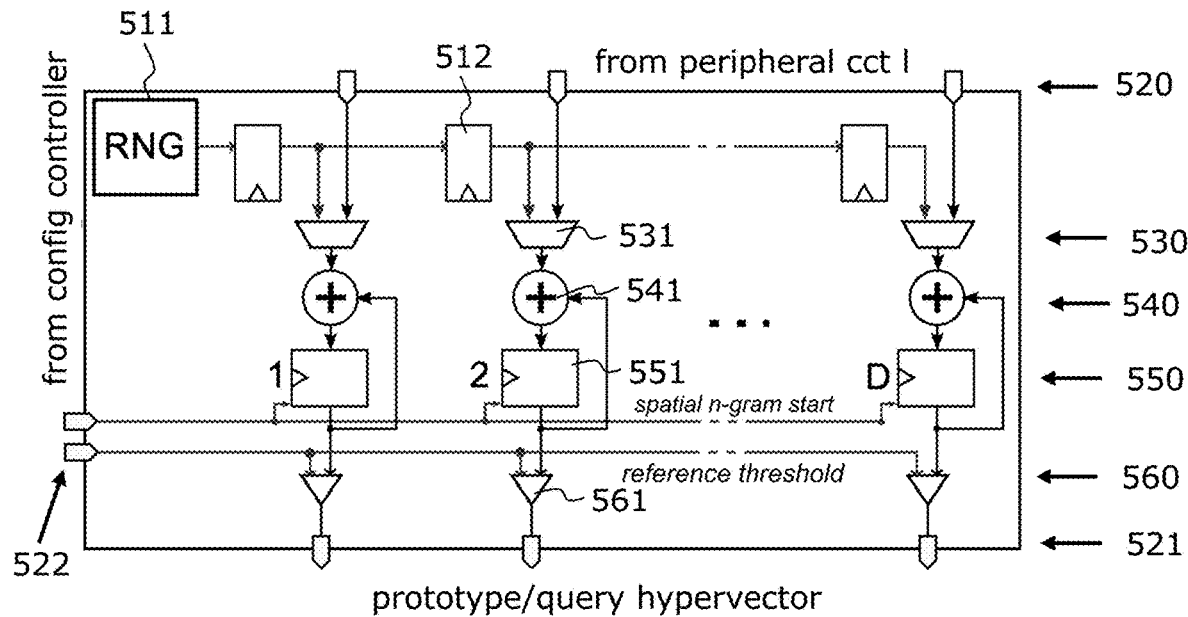
FIG. 5          130
FIG. 6          600

(12)

DEVICE FOR HIGH DIMENSIONAL ENCODING

BACKGROUND

The invention is notably directed to a device for high-dimensional encoding of a plurality of sequences of quantitative data signals. The invention further concerns a related method and a related computer program product.

High-dimensional (HD) computing is a brain-inspired non von Neumann machine learning model based on representing information with high-dimensional vectors. High-dimensional vectors are holographic and (pseudo)random with independent and identically distributed (i.i.d.) components. HD computing is robust in the presence of failures, defects, variations and noise.

SUMMARY

According to a first aspect the invention is embodied as a device for high-dimensional encoding of a plurality of sequences of quantitative data signals. The device comprises a plurality of input channels for receiving the plurality of sequences of quantitative data signals and an encoding unit. The encoding unit is configured to perform a temporal high-dimensional encoding of n-grams of the plurality of sequences of quantitative data signals; thereby creating a plurality of temporally encoded hypervectors for the plurality of input channels. The encoding unit is further configured to perform a spatial high-dimensional encoding of the plurality of temporally encoded hypervectors, thereby creating a temporally and spatially encoded hypervector. The device further comprises a configuration controller. The configuration controller is adapted to configure the high-dimensional encoding in dependence on one or more hyperparameter values.

According to an embodiment of another aspect of the invention a method for operating a device for high-dimensional encoding of a plurality of sequences of quantitative data signals is provided. The device comprises a plurality of input channels, an encoding unit and a configuration controller. The method comprises steps of receiving, via the plurality of input channels, the plurality of sequences of quantitative data signals. The method comprises further steps of performing, by the encoding unit, a temporal high-dimensional encoding of n-grams of the plurality of sequences of quantitative data signals, thereby creating a plurality of temporally encoded hypervectors for the plurality of input channels. The method comprises further steps of performing, by the encoding unit, a spatial high-dimensional encoding of the plurality of temporally encoded hypervectors, thereby creating a temporally and spatially encoded hypervector. The method comprises further steps of configuring, by the configuration controller, the high-dimensional encoding in dependence on one or more hyperparameter values.

According to an embodiment of another aspect of the invention, a computer program product for operating a device for high-dimensional encoding of a plurality of sequences of quantitative data signals is provided. The device comprises a plurality of input channels, an encoding unit and a configuration controller. The computer program product comprises a computer readable storage medium having program instructions embodied therewith, the program instructions executable by a control unit of the device to cause the control unit to perform a method comprising receiving, via the plurality of input channels, the plurality of sequences of quantitative data signals. The method further comprises performing, by the encoding unit, a temporal high-dimensional encoding of n-grams of the plurality of sequences of quantitative data signals; thereby creating a plurality of temporally encoded hypervectors for the plurality of input channels. The method further comprises performing, by the encoding unit, a spatial high-dimensional encoding of the plurality of temporally encoded hypervectors, thereby creating a temporally and spatially encoded hypervector. The method further comprises configuring, by the configuration controller, the high-dimensional encoding in dependence on one or more hyperparameter values.

Embodiments of the invention will be described in more detail below, by way of illustrative and non-limiting examples, with reference to the accompanying drawings.

According to an embodiment, the device is configured to store the basis hypervectors as binary conductance states of the resistive devices. This facilitates an efficient data processing as well as an efficient programming.

According to an embodiment, the basis hypervectors have a dimension D and the memory crossbar array comprises D resistive devices per row. D is an integer. According to such an embodiment the basis hypervectors may be stored row by row in an efficient manner. The dimension D of the hypervectors may be in the order of 100, 1000, 10000 or more.

According to an embodiment, the quantitative data signals comprise a plurality of signal quantization levels. Furthermore, the memory crossbar array is configured to store for each of the plurality of input channels a separate basis hypervector for each of the plurality of signal quantization levels. This is an efficient and elegant method to bind the basis hypervectors to a respective input channel and to take account of the channel specifics.

According to an embodiment, the quantitative data signals comprise a plurality of signal quantization levels. The device is configured to generate the basis hypervectors by providing for each of the input channels a channel identity hypervector by providing for each of the plurality of signal quantization levels a signal level hypervectors. The device is further configured to precompute the basis hypervector as follows:

$$BH_{m,l} = ID_m * SL_l; \forall m \in (1, \ldots, M), \forall l \in (1, \ldots, L) \tag{1}$$

In the above formula $BH_{m,l}$ are the basis hypervectors, $ID_m$ are the channel identity hypervectors, $SL_l$ are the signal level hypervectors, M is the total number of input channels and L is the total number of signal quantization levels in the quantitative data signals. The symbol * represents a binding operation. The binding operation may be in particular a component wise XOR operation. This provides an efficient and advantageous encoding of the basis hypervectors.

According to an embodiment of another aspect of the invention a method for operating a device for high-dimensional encoding of a plurality of sequences of quantitative data signals is provided. The device comprises a memory crossbar array comprising a plurality of resistive devices, a first peripheral circuit connected to the memory crossbar array and a second peripheral circuit connected to the first peripheral circuit. The method comprises storing elements of a plurality of precomputed basis hypervectors as conductance states of the resistive devices of the memory crossbar arrays, wherein the basis hypervectors are bound to the respective input channel. The method further comprises method comprises steps receiving the plurality of sequences of quantitative data signals via a plurality of input channels and performing, by the first peripheral circuit, a temporal encoding of n-grams of the quantitative data signals of the plurality of input channels, thereby creating a plurality of temporally encoded hypervectors for the plurality of input channels. The method further comprises a step of performing, by the second peripheral circuit, a spatial encoding of the plurality of temporally encoded hypervectors of the plurality of input channels, thereby creating a temporally and spatially encoded hypervector.

According to an embodiment of another aspect of the invention, a computer program product for operating a device for high-dimensional encoding of a plurality of sequences of quantitative data signals is provided. The device comprises a memory crossbar array comprising a plurality of resistive devices, a first peripheral circuit connected to the memory crossbar array and a second peripheral circuit connected to the first peripheral circuit. The computer program product comprises a computer readable storage medium having program instructions embodied therewith, the program instructions executable by a control unit of the device to cause the control unit to perform a method comprising storing elements of a plurality of precomputed basis hypervectors as conductance states of the resistive devices of the memory crossbar arrays, wherein the basis hypervectors are bound to the respective input channel. The method further comprises steps of receiving the plurality of sequences of quantitative data signals via a plurality of input channels, performing, by the first peripheral circuit, a temporal encoding of n-grams of the quantitative data signals of the plurality of input channels, thereby creating a plurality of temporally encoded hypervectors for the plurality of input channels, and performing, by the second peripheral circuit, a spatial encoding of the plurality of temporally encoded hypervectors of the plurality of input channels, thereby creating a temporally and spatially encoded hypervector.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

FIG. 5 shows a more detailed schematic diagram of a second peripheral circuit;

FIG. 6 shows a table to illustrate the parametric space of a configuration controller according to embodiments of the invention;

DETAILED DESCRIPTION

Figure 1:
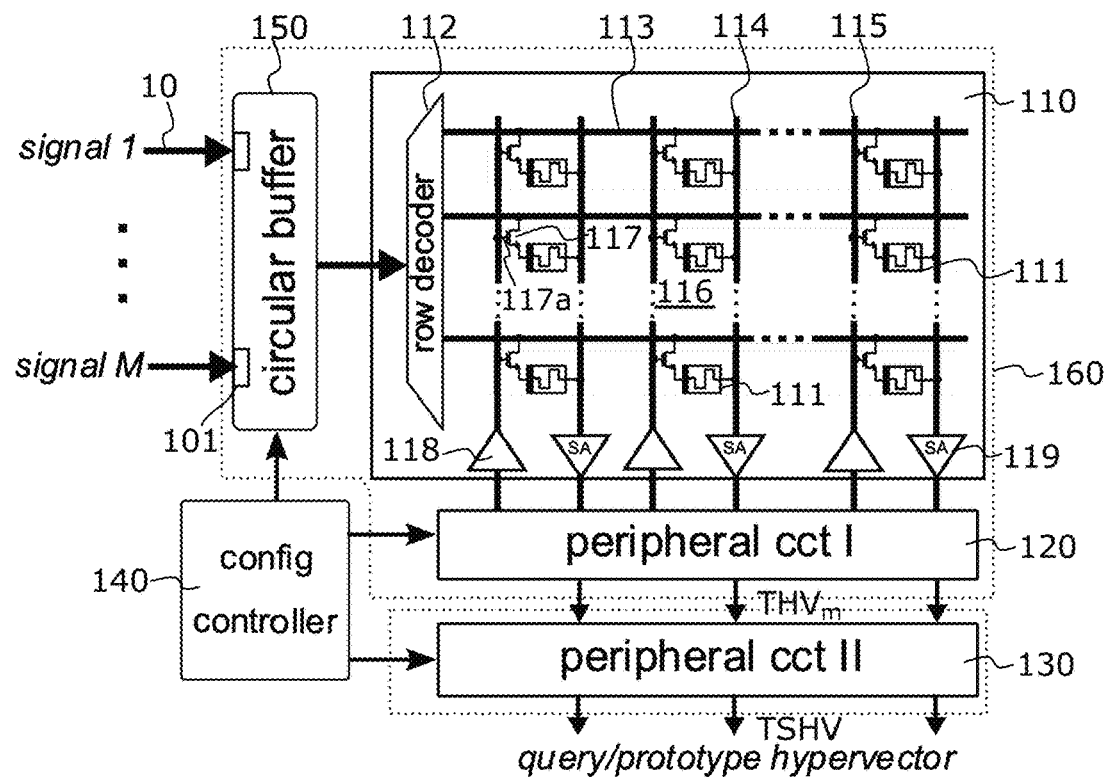
FIG. 1 is a simplified schematic block diagram of a device for high-dimensional encoding of a plurality of sequences of quantitative data signals.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

High-dimensional (HD) computing is a brain-inspired non von Neumann machine learning model based on representing information with high-dimensional vectors. A processor based on HD computing may be seen as an extremely wide dataflow processor with a small instruction set of bit-level operations.

High-dimensional computing represents information by projecting data onto vectors in a high-dimensional space. HD vectors may be in particular embodied holographic and (pseudo)random with independent and identically distributed (i.i.d.) components. High-dimensional computing may also be denoted as hyperdimensional computing. High-dimensional vectors may also be denoted as hypervectors. According to embodiments, the high-dimensional vectors/hypervectors may have dimensions of more than 100 elements, of more than 1000 elements or of more than 10000 elements.

Nanoscale memory devices, whose resistance depends on the history of the electric signals applied, could become critical building blocks in new computing paradigms, such as brain-inspired computing and memcomputing.

One promising example for resistive memory devices are phase-change memory (PCM) devices. PCM is a non-volatile solid-state memory technology that exploits the reversible, thermally-assisted switching of phase-change materials, in particular chalcogenide compounds such as GST (Germanium-Antimony-Tellurium), between states with different electrical resistance. The fundamental storage unit (the "cell") can be programmed into a number of different states, or levels, which exhibit different resistance characteristics. The programmable cell-states can be used to represent different data values, permitting storage of information. Reading and writing of data in PCM cells is achieved by applying appropriate voltages to the phase-change material via a pair of electrodes associated with each cell. In a write operation, the resulting programming signal causes Joule heating of the phase-change material to an appropriate temperature to induce the desired cell-state on cooling. Reading of PCM cells is performed using cell resistance as a metric for cell-state. An applied read voltage causes current to flow through the cell, this current being dependent on resistance of the cell. Measurement of the cell current therefore provides an indication of the programmed cell state.

High-dimensional computing may be used for manipulating and comparing large patterns within the memory. A processor based on HD computing may be seen as an extremely wide dataflow processor with a small instruction set of bit-level operations. For learning and inference tasks, the HD processor is composed of two main modules: encoding, and associative memory (or distance computation).

HD computing has also been proposed for bio-signal processing. Such signals comprise a set of parallel analog input signals, e.g. EMG-signals. By a suitable discretization, the analog parallel input signals establish a plurality/multiple sequences of quantitative data signals which may be processed by HD-computing.

HD encoding of multiple sequences of quantitative data has been shown to work in digital processing units.

However, there remains a need for advantageous devices for HD-encoding of multiple sequences of quantitative data signals.

An associative memory module may be defined as a memory module which is configured to compare input data, in particular query hypervectors, with data stored in the associative memory module, in particular with stored profile hypervectors. An associative memory module may be also denoted as content-addressable memory (CAM) or as associative storage.

For learning and inference tasks, a device for high-dimensional computing may comprise a module for performing a random projection to the HD space, an encoding module and an associative memory module. The first two modules may utilize random indexing with Multiply-Add-Permute (MAP) operations that allow a high degree of parallelism by needing to communicate with only a local component or its immediate neighbors. In the associative memory module, the distance computation may be performed in a distributed fashion.

According to embodiments of the invention, a resistive element may be defined as an element which comprises a resistive material and whose electrical resistance can be changed by applying an electrical programming signal to the resistive element. The resistive element may be in particular embodied as resistive memory element. The electrical programming signal may be e.g. a current flowing through the resistive memory element, or an electrical voltage applied to the resistive memory element. The current and/or voltage may be e.g. applied to the resistive memory element in the form of pulses. As a result, the electrical resistance of a resistive memory element depends on the history of current that had previously flown through the memory element and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g. a chalcogenide. These resistive memory elements exhibit good performance in terms of power consumption, integration density potential, retention, and endurance.

Embodiments of the invention may bring significant power and/or speed advantages compared to conventional von-Neumann approaches.

Quantitative data signals are measures of values or counts and are expressed as numbers. Quantitative data are data about numeric variables. Qualitative data are measures of 'types' and may be represented by a name, symbol, or a number code.

According to embodiments quantitative data signals may be in particular biopotential signals or electrophysiological signals, also denoted as ExG signals. Such electrophysiological signals encompass EMG (electromyography) signals, EEG (electroencephalography) signals and ECG (electrocardiography) signals.

Figure 10:
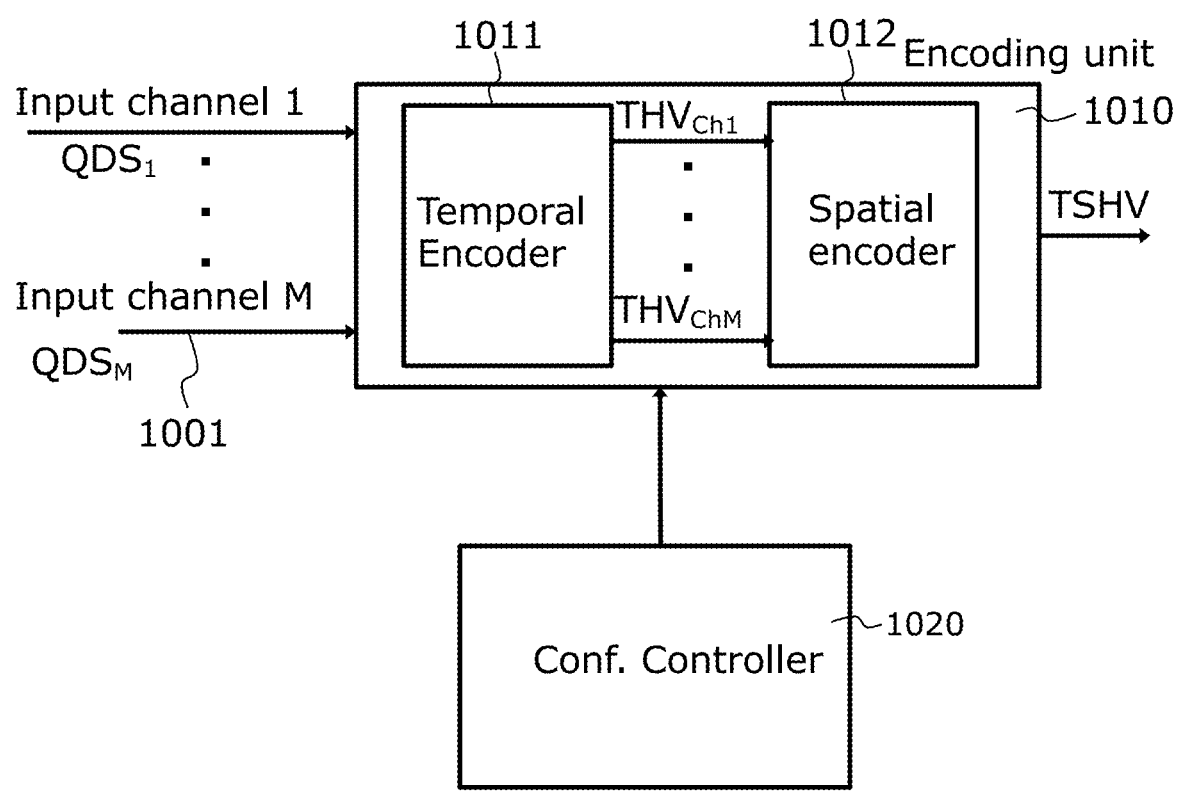
FIG. 10 shows a high-level schematic block diagram of a device 1000 for high-dimensional encoding of a plurality of sequences of quantitative data signals according to an embodiment of the invention.

Referring at first to FIG. 10, a high-level schematic block diagram of a device 1000 for high-dimensional encoding of a plurality of sequences of quantitative data signals according to an embodiment of the invention is shown.

The device 1000 comprises a plurality of input channels 1001, in this example M input channels, for receiving a plurality of sequences of quantitative data signals QDS. The device 1000 further comprises an encoding unit 1010. The encoding unit 1010 comprises a temporal encoder 1011 configured to perform a temporal high-dimensional encoding of n-grams of the quantitative data signals QDS of the input channels. This creates a plurality of temporally encoded hypervectors $THV_{Chm}$ for the plurality of input channels. The encoding unit 1010 further comprises a spatial encoder 1012 configured to perform a spatial high-dimensional encoding of the plurality of temporally encoded hypervectors $THV_{Chm}$. This creates a temporally and spatially encoded hypervector TSHV.

The device 1000 further comprises a configuration controller 1020. The configuration controller 1020 is adapted to configure the high-dimensional encoding in dependence on one or more hyperparameter values. The hyperparameter values include the number L of signal quantization levels of the quantitative data signals QSD, the number M of the plurality of input channels, and/or the n-gram size N of the n-grams of the temporal encoding. In particular, the configuration controller 1020 may set different signal quantization levels and/or different n-gram sizes per input channel. This allows to adapt the signal quantization levels and/or the n-gram sizes to the respective channel characteristics and/or specifics.

Referring now to FIG. 1, a simplified schematic block diagram of a device 100 for high-dimensional encoding of a plurality of sequences of quantitative data signals 10 is shown. The device 100 comprises a memory crossbar array 110 comprising a plurality of resistive devices 111. The memory crossbar array 110 comprises a row decoder 112 for decoding and addressing row lines 113 of the memory crossbar array 110. The memory crossbar array 110 may be a phase change memory (PCM) comprising phase-change memory elements, a conductive bridge random access memory (CBRAM), a metal-oxide resistive random access memory (RRAM), a magneto-resistive random access memory (MRAM), a ferroelectric random access memory (FeRAM) or an optical memory. According to another embodiment it may be a system memory comprising system elements. The system elements may comprise e.g. a plurality of transistors, resistors, capacitors, and/or inductors which are configured to jointly emulate a behavior of a resistive element.

In the following it is assumed that the memory crossbar array is embodied as PCM array. Accordingly, the memory crossbar array 110 comprises a plurality of PCM cells as resistive devices 111. The PCM cells may comprise a plurality of programmable resistance states. The plurality of programmable resistance-states corresponds to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the crystalline phase within the otherwise amorphous PCM material. The programmable cell-states are typically defined in terms of predetermined reference values, or ranges of values, of the resistance metric used for read-detection.

The memory crossbar array 110 comprises a plurality of row lines 113, a plurality of column lines 114, a plurality of access lines 115 and a plurality of junctions 116 arranged between the plurality of row lines 113 and the plurality of column lines 114. Each junction 116 comprises a resistive devices 111. More particularly, each junction 116 comprises a serial arrangement of the resistive devices 111 and an access element 117, in particular an access transistor, comprising an access terminal 117a, in particular a gate or gate terminal of an access transistor, for accessing the resistive devices 111.

The device 100 comprises a first peripheral circuit 120 which is electrically connected to the memory crossbar array 110 and a second peripheral circuit 130 which is electrically connected to the first peripheral circuit 120. The device 100 further comprises a configuration controller 140 and a circular buffer 150.

The device 100 is configured to receive the plurality of sequences of quantitative data signals 10 via a plurality of input channels 101. In the example of FIG. 1 the device 100 receives M data signals 10 denoted with signal 1, . . . , signal M. The quantitative data signals 10 may be in particular embodied as electrophysiological (ExG) signals such as electromyography (EMG) signals, electroencephalography (EEG) signals or electrocardiography (ECG) signals.

The signals 10 are quantitative data signals, i.e. they have or represent a numerical value. More particularly, the quantitative data signals may have a plurality of signal quantization levels. According to an example the signals 10 may have 20 different signal quantization levels ranging from 0 to 19. According to an example, the signals 10 may have 20 different signal quantization levels which may correspond e.g. to voltage levels of the input signals 10. The quantization levels may be derived e.g. by discretization of the voltage levels of an analog input signal, e.g. an ExG signal. The discretization may be performed e.g. by an analog-to-digital converter (ADC). As an example, level 0 may correspond to a voltage range of the analog input signal between 0 V and 1 mV and level 19 to a voltage range of the analog input signal between 19 mV and 20 mV.

The device 100 is configured to store elements of a plurality of precomputed basis hypervectors as conductance states of the resistive devices 111 of the memory crossbar array 110. The plurality of basis hypervectors are bound to the respective input channel 101. More particularly, the memory crossbar array 110 stores for each of the plurality of input channels 101 a separate set of basis hypervectors.

This will be explained further with reference to FIG. 2.

Figure 2:
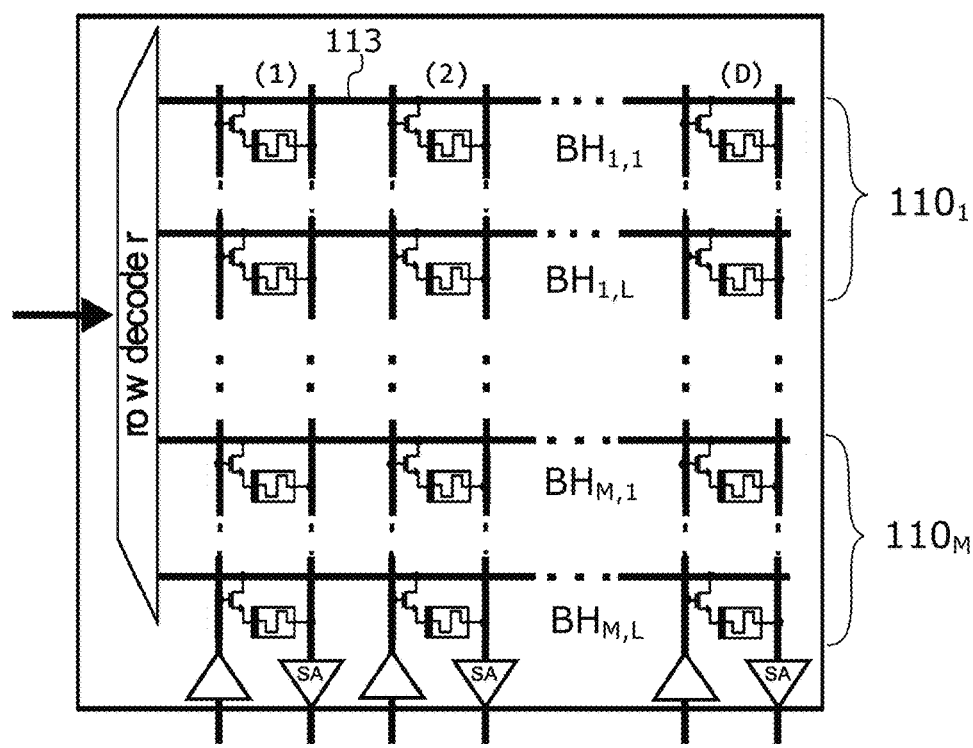
FIG. 2 shows an enlarged view of a memory crossbar array according to an embodiment of the invention.

FIG. 2 shows an enlarged view of the memory crossbar array 110 according to an embodiment of the invention.

For the example of FIG. 2 it is assumed that the memory crossbar array 110 receives as input signals M quantitative data signals, wherein the M quantitative data signals may have L different signal quantization levels. The memory crossbar array 110 is configured to store M times L different basis hypervectors BH. Each of the basis hypervectors BH is stored in a row line 113 of the memory crossbar array 110. More particularly, M areas $110_X$ of the memory crossbar array 110 each store L hypervectors $BH_{m,1}, \ldots, BH_{m,L}$. In the example of FIG. 2 only the first area $110_1$ and the last area $110_M$ is shown. The first area $110_1$ stores L hypervectors $BH_{1,1}, \ldots, BH_{1,L}$ and the last area $110_M$ stores L hypervectors $BH_{M,1}, \ldots, BH_{M,L}$. As an example, given a number L of 20 signal quantization levels and a number M of 4 input channels/input signals, the memory crossbar array 110 stores 20 times 4=80 basis hypervectors.

The basis hypervectors may be precomputed by the device 100 and may then be programmed to the resistive devices 111. The computation may be performed as follows according to embodiments:

The device 100 provides for each of the input channels 101 a channel identity hypervector $ID_m$. Furthermore, the device 100 provides for each of the plurality of signal quantization levels a signal level hypervector SU. Then, the device 100 precomputes the basis hypervector as follows:

$$BH_{m,l} = ID_m * SL_l; \forall m \in (1, \ldots, M), \forall l \in (1, \ldots, L) \qquad (2)$$

wherein M is the total number of input channels/input signals, L is the total number of signal quantization levels in the quantitative data signals, and * represents a binding operation, in particular a component wise XOR-operation.

The device 100 stores the basis hypervectors $BH_{m,l}$ as binary conductance states of the resistive devices 111. As illustrated in FIG. 2, the basis hypervectors have a dimension D. The dimension D may be any suitable number. Typically, the dimension D may be in the range of 100, 1000, 10000 or more.

The memory crossbar array 110 comprises gate line control buffers 118 for controlling access terminal 117a of the access element 117 of the resistive devices 111.

Furthermore, the memory crossbar array 110 comprises sense amplifiers 119 for sensing a column line result of the column lines 114 of the memory crossbar array 110.

The first peripheral circuit 120 is configured to perform a temporal encoding of n-grams of the quantitative data signals 10 of the plurality of input channels 101. The n-grams of each of the input channels 101 each comprise a consecutive/contiguous sequence of n quantitative data signals. This generates/creates a plurality of temporally encoded hypervectors for the plurality of input channels 101. More particularly, it generates for each of the n-grams of a given input channel m a temporally encoded hypervector $THV_m$.

The second peripheral circuit 130 is configured to perform a spatial encoding of the plurality of temporally encoded hypervectors $THV_m$ of the plurality of input channels. This generates/creates a temporally and spatially encoded hypervector TSHV.

The circular buffer 150 is configured to receive the plurality of sequences of quantitative data signals 10. Then the circular buffer 150 decodes, sequentially, row addresses of the memory crossbar array 110. The decoded row addresses correspond to the basis-hypervectors of the respective quantitative data signals 10. More particularly, the circular buffer 150 decodes the row address of the row line 113 which stores the basis hypervector $BH_{m,l}$ which corresponds to the respective signal quantization level and the input channel of the respective input signal.

The memory crossbar array 110, the first peripheral circuit 120, and the circular buffer 150 are configured to operate together to perform the temporal encoding and may be commonly referred to as temporal encoder 160.

Figure 3:
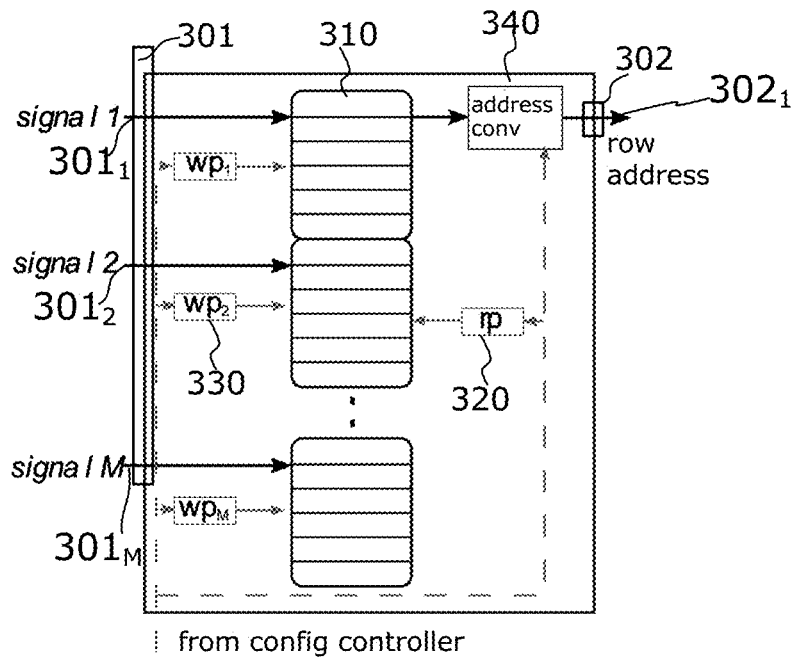
FIG. 3 shows a more detailed functional block diagram of a circular buffer.

The functioning of the circular buffer 150 will be further explained with reference to FIG. 3, which shows a more detailed functional block diagram of the circular buffer 150.

The circular buffer 150 comprises an input interface 301 having M inputs $301_1, \ldots, 301_M$ corresponding to the M quantitative data signals 10 received via the input channels 101. The circular buffer 150 further comprises an output interface 302 having a single output 3021 configured to provide, sequentially, a single output signal for decoding a respective row address of the memory crossbar array 110.

The input interface 301 and the output interface 302 are configured to operate in an asynchronous manner such that the frequency of the input interface 301 operates M times N slower than the output interface 302, wherein N denotes the n-gram size of the n-grams of the input signals 10. The circular buffer 150 comprises a memory 310 for storing the signal quantization levels of the input signals 10. The circular buffer 150 is coupled to the configuration controller 140 and receives configuration data from the configuration controller 140, as illustrated by dotted lines.

The circular buffer 150 is configured to read, for each set of input samples received, the last N samples from each input channel, corresponding to the size N of the n-grams, from the memory 310, first in the chronological order of the chosen input channel and then in the channel order. The circular buffer 150 converts, by an address converter 340, the signal quantization levels of the respective input channel to a corresponding row address that drives the row decoder 112 of the memory crossbar array 110 sequentially.

The circular buffer 150 comprises a read pointer (rp) 320 which is configured to calculate the sequence of addresses on the circular buffer 150 for accessing the elements stored in the memory 310. The circular buffer 150 further comprises a set of write pointers (wp) 330. The set of write pointers 330 (e.g., $wp_1$, $wp_2$, ..., $wp_M$) is used for calculating the location to store the incoming quantitative data signal for each of the input channels.

Figure 4:
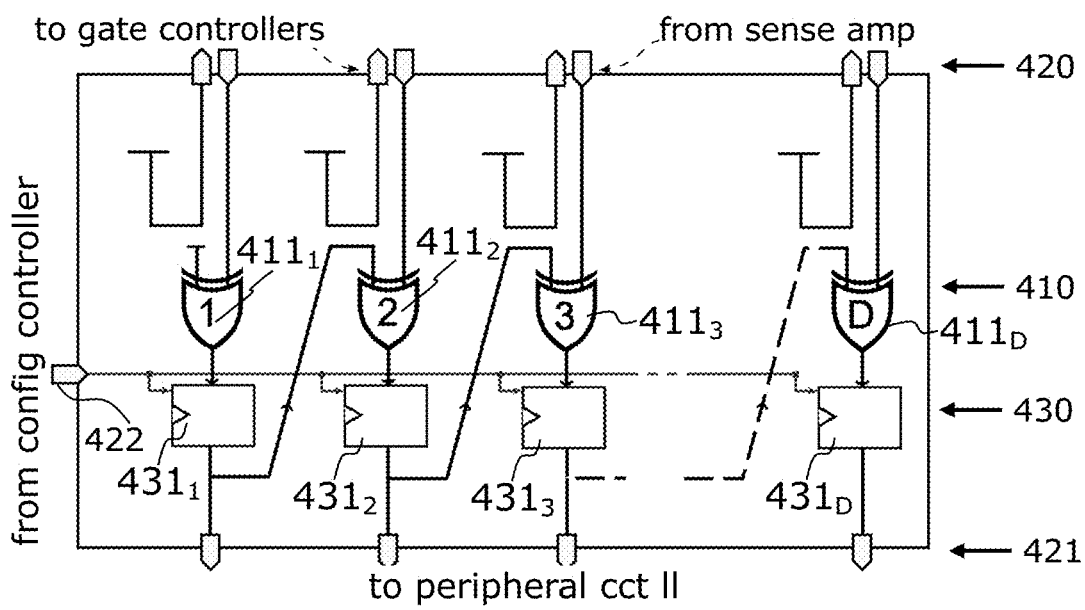
FIG. 4 shows a more detailed schematic diagram of a first peripheral circuit.

FIG. 4 shows a more detailed schematic diagram of the first peripheral circuit 120. The first peripheral circuit 120 comprises logic circuitry 410 which is configured to perform a binding operation for the temporal encoding. According to the example of FIG. 4 the logic circuitry 410 is embodied as XOR-circuitry. More particularly, the logic circuitry 410 comprises D XOR-gates 411 (e.g., $411_1$, $411_2$, $411_3$, $411_D$).

The first peripheral circuit 120 further comprises buffer circuitry 430 to store the temporally encoded hypervectors and intermediate binding results of the temporal encoding. More particularly, the buffer circuitry 430 comprises D buffers 431 (e.g., $431_1$, $431_2$, $431_3$, $431_D$). The output of the first buffer $431_1$ is coupled to an input of the second XOR gate $411_2$, the output of the second buffer $431_2$ is coupled to an input of the third XOR gate $411_3$ and so on.

The first peripheral circuit 120 further comprises interface circuitry 420 to interface with the gate line control buffers 118 and the sense amplifiers 119 of the memory crossbar array 110 to perform the temporal encoding. The first peripheral circuit 120 further comprises interface circuitry 421 to interface with the second peripheral circuit 130 and interface circuitry 422 to interface with the configuration controller 140. The configuration controller 140 may reset e.g. the buffer circuitry 430 to process new input data.

The first peripheral circuit 120 provides as output temporally encoded hypervectors of the n-grams of the input channels and provides them for further processing to the second peripheral circuit 130.

FIG. 5 shows a more detailed schematic diagram of an exemplary embodiment of the second peripheral circuit 130. The second peripheral circuit 130 is responsible for spatial encoding. The second peripheral circuit 130 comprises interface circuitry 520 to interface with the first peripheral circuit 120 and interface circuitry 521 to provide as output signal a prototype or a query hypervector. The second peripheral circuit 130 further comprises interface circuitry 522 to interface with the configuration controller 140.

The second peripheral circuit 130 further comprises a random bit generator/random number generator (RNG) 511 and associated buffer circuitry encompassing D buffers 512 for serial bit shifting to provide a random hypervector.

The second peripheral circuit 130 further comprises multiplexing circuitry 530 comprising D multiplexers 531 for multiplexing between the random hypervector and the temporally encoded hypervector provided by the first peripheral circuit 120. The random hypervector is provided by the random bit generator 511 and the associated buffer circuitry 512. The random bit generator 511 and its associated buffer circuitry 512 is used when M is even to facilitate a majority logic for an even number of input channels. The second peripheral circuit 130 further comprises logic circuitry 540 for performing a bundling operation of the spatial encoding. The logic circuitry 540 comprises adders 541. The output of the adders 541 is provided to a buffer circuitry 550, of the second peripheral circuit 130, which comprises a set of D buffers 551. The output of the buffers 551 is fed back to the adders 541. More particularly, the adders 541 add the output of the multiplexers 531 to the output of the buffers 551, thereby performing an accumulation. Hence the buffers 551 store the result of the accumulation. The buffers 551 store the result of the bundling operation performed by logic circuitry 540. The output of the buffers 551 is provided to logic circuitry 560 (i.e., threshold logic) comprising D comparators 561. The comparators 561 compare the output of the buffers 551 with a reference a threshold, thereby performing a thresholding of the output of the buffer circuitry 550.

FIG. 6 shows a table to illustrate the functionality of the configuration controller 140 according to embodiments of the invention. More particularly, the table shows an exemplary embodiment of configurations that can be configured by the configuration controller. L denotes the number of signal quantization levels, N the n-gram-size of the temporal encoding, and Ch1 and Ch2 denotes two different input channels.

In the exemplary embodiment each pair connected by an arrow represents one choice in the hyperparameter space. According to the FIG. 6 the configuration controller according to embodiments of the invention allows to configure the high-dimensional encoding in dependence on one or more hyperparameter values, in particular in dependence on the number L of signal quantization levels of the quantitative data, the number of the plurality of input channels, and/or the n-gram size N of the n-grams of the temporal encoding.

As illustrated in table 600 of FIG. 6, it is possible to choose for both exemplary channels Ch1 and Ch2 the same signal quantization levels and the same n-gram size. However, it is also possible to choose different signal quantization levels and different n-gram sizes per input channel. As an example, one may choose for the channel Ch1 the number of signal quantization levels L=5 and the n-gram-size N as N=3, whereas for the channel Ch2 the number of signal quantization levels L may be chosen as L=10 and the n-gram-size N as N=4. As another example, one may choose for the channel Ch1 the number of signal quantization levels L=5 and the n-gram-size N as N=4, whereas for the channel Ch2 the number of signal quantization levels L may be chosen as L=10 and the n-gram-size N as N=4. It should be noted that some possible further choices are not shown in FIG. 6 for ease of illustration.

Figure 7:
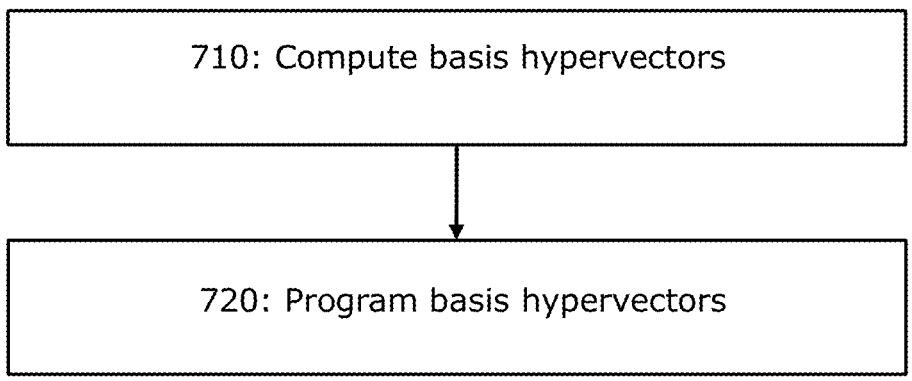
FIG. 7 shows a flow chart of methods steps of a method for programming the memory crossbar array of the device for high-dimensional encoding.

FIG. 7 shows a flow chart 700 of methods steps of a method for programming the memory crossbar array 110 of the device 100 for high-dimensional encoding.

At a step 710, the device 100 computes the basis hypervectors. The computation may be performed for different sets or combinations of input channels, signal quantization levels and n-gram-sizes.

At a step 720, the device 100 programs or in other words stores the computed basis hypervectors or in other words the elements of the precomputed basis hypervectors as binary conductance states of the resistive devices 111 of the memory crossbar array 110. The basis hypervectors are bound to respective input channels.

Figure 8:
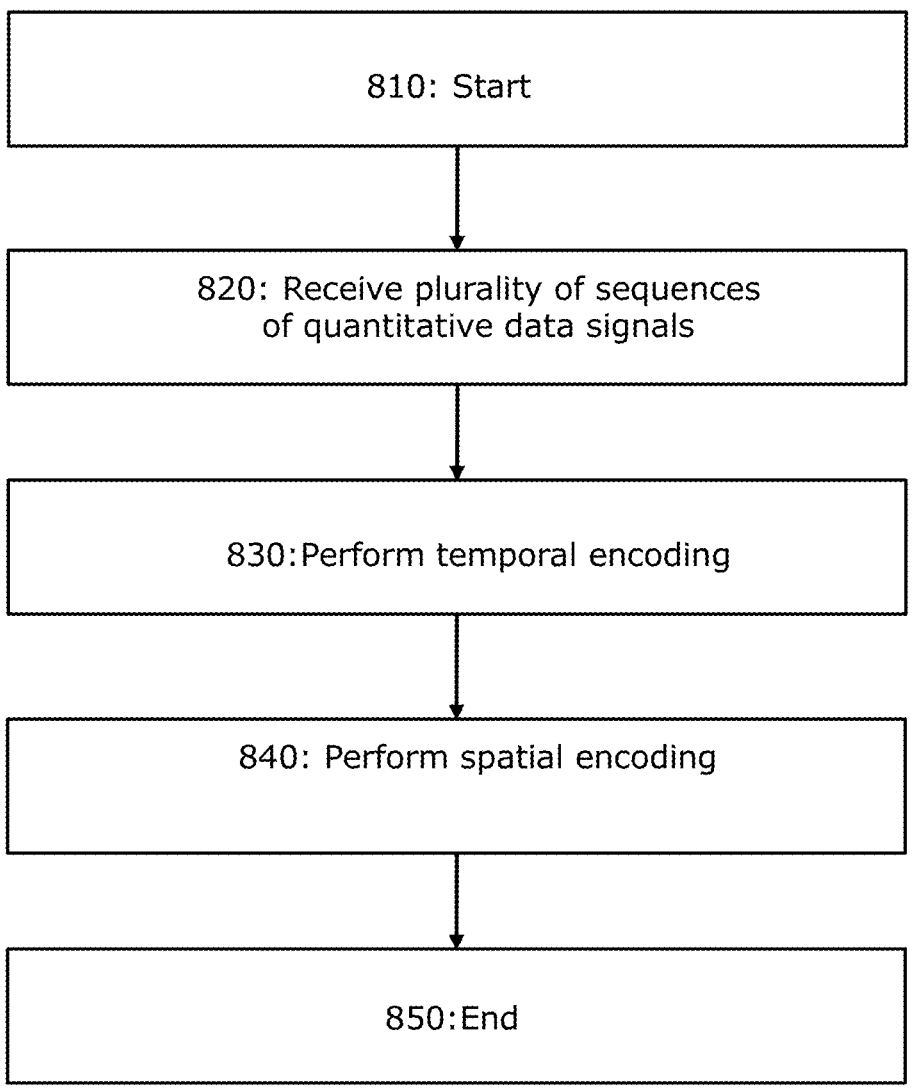
FIG. 8 shows a flow chart of methods steps of a method for operating a device for high-dimensional encoding.

FIG. 8 shows a flow chart 800 of methods steps of a method for operating a device for high-dimensional encoding, e.g. the device 100 as shown in FIG. 1.

At a step 810, the method starts. At a step 820, the device 100 receives a plurality of sequences of quantitative data signals via a plurality of input channels (e.g., input channels 101). At a step 830, the first peripheral circuit (e.g., first peripheral circuit 120) performs a temporal encoding of n-grams of the quantitative data signals of the plurality of input channels. This creates a plurality of temporally encoded hypervectors for the plurality of input channels. At a step 840, the second peripheral circuit (e.g., second peripheral circuit 130) performs a spatial encoding of the plurality of temporally encoded hypervectors of the plurality of input channels. This creates a temporally and spatially encoded hypervector. The steps 820 to 840 may be repeated as often as desired. At a step 850, the method ends.

Figure 9:
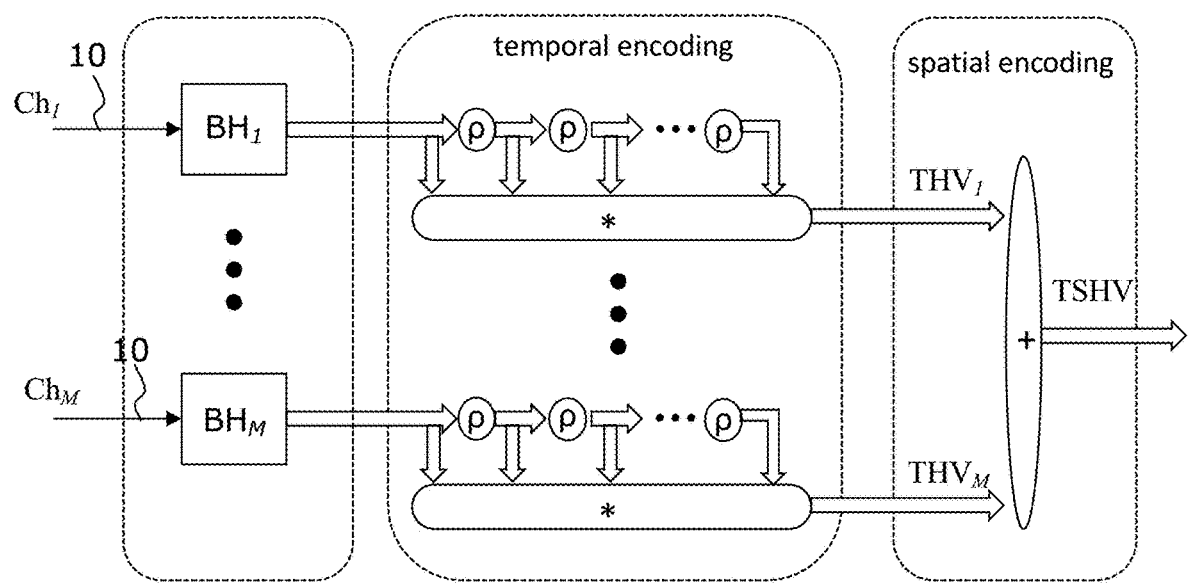
FIG. 9 illustrates the encoding dataflow of a device for high-dimensional encoding according to an embodiment of the invention.

FIG. 9 illustrates the encoding dataflow 900 of a device for high-dimensional encoding according to an embodiment of the invention. The preprocessed input signals 10 of the device received via the channels $Ch_m$ are mapped to hypervectors $BH_m$ that are chosen from a set of basis hypervectors, depending on the quantized input signal level. Then the device performs the temporal encoding by a permutation of the respective base hypervectors. This results in temporally encoded hypervectors $THV_m$. Finally, the device performs a spatial encoding of the temporally encoded hypervectors. This results in a temporally and spatially encoded hypervector TSHV.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. In general, modifications described for one embodiment may be applied to another embodiment as appropriate.

What is claimed is:

1. A device for high-dimensional encoding of a plurality of sequences of quantitative data signals, wherein the device comprises:
   a plurality of input channels for receiving the plurality of sequences of quantitative data signals;
   an encoding unit for performing a temporal high-dimensional encoding of n-grams of the plurality of sequences of quantitative data signals thereby creating a plurality of temporally encoded hypervectors for the plurality of input channels and performing a spatial high-dimensional encoding of the plurality of temporally encoded hypervectors thereby creating a temporally and spatially encoded hypervector; and
   a configuration controller for configuring the high-dimensional encoding in dependence on one or more hyperparameter values.

2. The device of claim 1, wherein the hyperparameter values comprise a number of signal quantization levels of the quantitative data, a number of the plurality of input channels, and/or an n-gram size of the n-grams of the temporal encoding.

3. The device of claim 1, wherein the configuration controller is adapted to set different signal quantization levels per input channel.

4. The device of claim 1, wherein the configuration controller is adapted to set different n-gram sizes per input channel.

5. The device of claim 1, wherein the device comprises a memory crossbar array comprising a plurality of resistive devices, a first peripheral circuit connected to the memory crossbar array, and a second peripheral circuit connected to the first peripheral circuit, and wherein the device is configured to:
   store elements of a plurality of precomputed basis hypervectors as conductance states of the plurality of resistive devices of the memory crossbar array, wherein the plurality of precomputed basis hypervectors are bound to respective input channels;
   perform, by the first peripheral circuit, a temporal encoding of n-grams of the plurality of sequences of quantitative data signals received via the plurality of input channels, thereby creating a plurality of temporally encoded hypervectors for the plurality of input channels; and
   perform, by the second peripheral circuit, a spatial encoding of the plurality of temporally encoded hypervectors of the plurality of input channels, thereby creating a temporally and spatially encoded hypervector.

6. The device of claim 5, being further configured to:
   store each of the plurality of basis hypervectors in a row of the memory crossbar array.

7. The device of claim 6, further comprising:
   a circular buffer configured to receive the plurality of sequences of quantitative data signals and to sequentially decode row addresses of the memory crossbar array corresponding to the basis-hypervectors of the respective quantitative data signals.

8. The device of claim 5, being further configured to:
   store the plurality of precomputed basis hypervectors as binary conductance states of the resistive devices.

9. The device of claim 5, wherein the basis hypervectors comprise a dimension number D, and wherein the memory crossbar array comprises a number D resistive devices per row.

10. The device of claim 5, wherein the plurality of sequences of quantitative data signals comprise a plurality of signal quantization levels, and wherein the memory crossbar array is configured to store for each of the plurality of input channels a basis hypervector for each of the plurality of signal quantization levels.

11. The device of claim 5, wherein the plurality of sequences of quantitative data signals comprise a plurality of signal quantization levels, and wherein the device is further configured to generate the precomputed basis hypervectors by:
   providing, for each of the input channels, a channel identity hypervector;
   providing, for each of the plurality of signal quantization levels, a signal level hypervector; and
   computing a basis hypervector by $BH_{m,l} = ID_m * SL_l$; $\forall m \in (1, \ldots, M)$, $\forall l \in (1, \ldots, L)$, wherein $BH_{m,l}$ are the basis hypervectors, $ID_m$ are the channel identity hypervectors, $SL_l$ are the signal level hypervectors, M is a total number of input channels, L is a total number of signal quantization levels in the quantitative data signals, and * represents a binding operation.

12. The device of claim 5, wherein the memory crossbar array comprises gate line control buffers which control a gate of access transistors of the resistive devices, and wherein the memory crossbar array comprises sense amplifiers which sense a column line result of column lines of the memory crossbar array, and wherein the first peripheral circuit is configured to interface with the gate line control buffers and the sense amplifiers to perform the temporal encoding.

13. The device of claim 5, wherein the first peripheral circuit comprises logic circuitry to perform a binding operation for the temporal encoding and buffer circuitry to store the plurality of temporally encoded hypervectors.

14. The device of claim 7, wherein the circular buffer comprises an input interface, having M inputs corresponding to the plurality of input channels, and an output interface configured to provide sequentially a single output signal for decoding a respective row address of the memory crossbar array, and wherein the input interface and the output interface are configured to operate in an asynchronous manner such that the frequency of the input interface operates M·N times slower than the output interface, and wherein N is the n-gram size of the n-grams.

15. The device of claim 5, wherein the second peripheral circuit comprises logic circuitry for performing a bundling operation of the spatial encoding, buffer circuitry to store a result of the bundling operation of the spatial encoding, and logic circuitry for thresholding the output of the buffer circuitry.

16. The device of claim 5, wherein the second peripheral circuit comprises a bit generator and buffer circuitry for serial bit shifting to provide a random hypervector, and a multiplexer for multiplexing between the random hypervector and a temporally encoded hypervector.

17. The device of claim 1, wherein the resistive devices are selected from the group consisting of: phase-change memory elements, conductive bridge random access memory elements (CBRAM), metal-oxide resistive random access memory elements (RRAM), magneto-resistive random access memory elements (MRAM), ferroelectric random access memory elements (FeRAM) and optical memory elements.

18. The device of claim 5, wherein the crossbar array comprises a plurality of row lines, a plurality of column lines, and a plurality of junctions arranged between the plurality of row lines and the plurality of column lines, wherein each junction of the plurality of junctions comprises a resistive memory element in a serial arrangement with an access element comprising an access terminal for accessing the resistive memory element.

19. A method for operating a device for high-dimensional encoding of a plurality of sequences of quantitative data signals, wherein the device comprises a plurality of input channels, an encoding unit, and a configuration controller, the method comprising:
  receiving, via the plurality of input channels, the plurality of sequences of quantitative data signals;
  performing, by the encoding unit, a temporal high-dimensional encoding of n-grams of the plurality of sequences of quantitative data signals thereby creating a plurality of temporally encoded hypervectors for the plurality of input channels and a spatial high-dimensional encoding of the plurality of temporally encoded hypervectors thereby creating a temporally and spatially encoded hypervector; and
  configuring, by the configuration controller, the high-dimensional encoding in dependence on one or more hyperparameter values.

20. A computer program product for operating a device for high-dimensional encoding of a plurality of sequences of quantitative data signals, wherein the device comprises a plurality of input channels, an encoding unit, and a configuration controller, the computer program product comprising:
  one or more non-transient computer-readable tangible storage media and program instructions collectively stored on the one or more non-transient computer-readable tangible storage media, the program instructions being executable by a computer, the program instructions comprising:
    program instructions to receive, via the plurality of input channels, the plurality of sequences of quantitative data signals;
    program instructions to perform, by the encoding unit, a temporal high-dimensional encoding of n-grams of the plurality of sequences of quantitative data signals thereby creating a plurality of temporally encoded hypervectors for the plurality of input channels and a spatial high-dimensional encoding of the plurality of temporally encoded hypervectors thereby creating a temporally and spatially encoded hypervector; and
    program instructions to configure, by the configuration controller, the high-dimensional encoding in dependence on one or more hyperparameter values.

* * * * *